(12) United States Patent
Widdup

(10) Patent No.: US 6,798,366 B1
(45) Date of Patent: Sep. 28, 2004

(54) **ARCHITECTURE FOR A FASTER MAX* COMPUTATION**

(75) Inventor: Benjamin J. Widdup, Glenwood (AU)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/628,699

(22) Filed: Jul. 28, 2003

(51) Int. Cl.$^7$ .................. H03M 13/00; H04L 27/06
(52) U.S. Cl. .................. 341/106; 341/94; 375/265; 375/341; 714/796
(58) Field of Search .................. 341/94, 106; 375/262, 375/265, 341; 714/792–796

(56) References Cited

U.S. PATENT DOCUMENTS

| | | | |
|---|---|---|---|
| 6,725,409 B1 * | 4/2004 | Wolf | 714/755 |
| 2002/0048329 A1 * | 4/2002 | Tran et al. | 375/340 |
| 2002/0095640 A1 * | 7/2002 | Arad et al. | 714/792 |
| 2002/0116680 A1 * | 8/2002 | Kim et al. | 714/786 |

OTHER PUBLICATIONS

Harrison, Implementation of a 3GPP Turbo Decoder on a Programmable DSP Core, White Paper Communications design Conference Oct. 2, 2001 San Jose, California.*

Kaza, J. et al., Energy Efficient Turbo Decoder, Proceedings of IEEE International Conference on Acoustics, Speech and Sign Processing (ICASP'02) May 13–17, 2002, vol. 3, pp. 3093–3096.*

SysonChip, Inc., Product Sheet—Alliance Core 3GPP Turbo Decoder, May 4, 2001.*

Vogt, J et al., Improving the Max–Log–MAP Turbo Decoder, Draft of submission to Electronic Letters Jun. 9, 2000; published Electronics Letters, Nov. 9, 2000, vol. 36 No. 23, pp. 1937–1939.*

SoftDSP Inc., Product Release Bulletin May 2000, Release 3GPP Compliant Turbo Decoder IP Core.Internet URL–http://www.softdsp.com/turbodecoder_feature-s.php.*

Chass, A. et al., Efficient Software Implementation of the Max–Log–MAP Turbo Decoder on the StarCore SC140 DSP, DSP Conference Proceedings, copyright 2000 CMP Media Inc.*

* cited by examiner

Primary Examiner—Howard Williams

(57) ABSTRACT

An architecture for a turbo decoder performs a faster max* computation. In this architecture, one or more lookup tables begin processing a digital signal prior to the most significant bit of the digital signal stabilizes. This technique allows processing in the lookup table to be accomplished during a period of time in which processing could not be accomplished previously. As a result, the architecture performs the max* computations at a faster rate than previous architectures.

24 Claims, 3 Drawing Sheets

ARCHITECTURE FOR A FASTER MAX* COMPUTATION

BACKGROUND OF THE INVENTION

1. Field of the Invention

The present invention relates generally to wireless communications systems and, more particularly, to turbo decoders used in wireless communications.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Although the first mobile telephone system for public use was developed in 1946, and improved in 1965, modern wireless technology was introduced in 1970 as the Advanced Mobile Phone Service (AMPS), which is the American analog cellular standar. Despite this early development, the first commercial cellular system began operating in Chicago in 1983, thus giving rise to one of the fastest growing consumer technologies in history. Indeed, so many people subscribed to cellular service by the mid-1990s that the critical problem for cellular carriers became that of capacity. Accordingly, cellular providers had to develop ways to derive more capacity.

The most extreme and costly method to increase capacity involved reducing cell sizes and introducing additional base stations. However, in many large metropolitan areas, it became increasingly difficult and costly to obtain permits to erect base stations and antennas. Accordingly, cellular providers desired a solution for increasing system capacity without requiring more base stations. One proposed solution involved the use of digital technology.

The first all digital systems, Personal Communication Services (PCS), were introduced in the United States in the mid-1990s. PCS is referred to as the second generation wireless service, with the first generation mobile telephone service being the analog service mentioned above. Various digital wireless technologies were developed, including Time Division Multiple Access (TDMA), Code Division Multiple Access (CDMA), and Global System for Mobile Communications (GSM). Because the advent of digital wireless communications greatly increased the capacity of wireless networks, cellular providers had more capacity to sell to eager subscribers. Thus, the rate of cellular subscriptions continued to increase.

There is currently a move to develop a global standard for wireless technology, which has been dubbed the third generation or "3G" wireless standard. It is likely that the third generation wireless technology will be an enhanced version of one of the three digital wireless technologies mentioned above. It is expected that such standardization will not only lead to further increases in capacity, but also lead to lower cost and increased efficiencies due to standardized networks that may be shared amongst various cellular providers.

As a result of the third generation developments, and in view of the likely continued increase in consumer demand, portable wireless applications, such as voice and/or data communications, will require greater rates at lower channel signal-to-noise ratios than ever before. Accordingly, developers are seeking techniques that provide faster and more reliable digital communications, while also reducing power consumption of the battery-powered portable devices used for such communication.

To achieve more reliable data transmission, more advanced error correcting techniques are being considered. One error correction technique known as turbo coding has a greater error correction capability than previously used codes, and it is specified as one of the coding options for the third generation standard. Indeed, the introduction of turbo codes in 1993 was considered as one of the most exciting and important developments in digital communications in many years. By using turbo codes, error correction can be done within 0.7 db of the Shannon limit, which is the theoretical limit of decoder performance. However, turbo coding and decoding is not a trivial exercise, and coders/decoders (codecs) based on turbo codes are quite complex. Such complexity, in the digital world, typically leads to slower processing and greater power consumption than other coding techniques that may be under consideration.

Turbo decoders, in particular, utilize complex decoding algorithms. Specifically, turbo decoders operate in an iterative fashion and, thus, require a number of computations to decode the signal accurately. The iterative decoding algorithm is typically performed in log space and referred to as the log-MAP decoding algorithm. One of the reasons that the log-MAP algorithm is useful involves the computational phenomenon that while multiplications and divisions are difficult in linear space, such multiplications and divisions become additions and subtractions, respectively, in log space. Although additions and subtractions in linear space become more difficult in log space, there are typically many more multiplications and divisions in linear space MAP decoding, so it generally makes sense to convert computations to log space and use the log-MAP algorithm. Indeed, if the MAP algorithm was performed in linear space, it would be so complex that it would be difficult, if not impossible, to achieve real time operation. Other advantages of operating the log-MAP algorithm are well known and need not be repeated herein.

One awkward computation when operating the log-MAP algorithm is the log of the sums of exponentials: $\ln(e^a+e^b+e^c+\ldots)$. This problem can be simplified using the following formula: $\ln(e^a+e^b)=\max(a,b)+\ln(1+e^{-|a-b|})$. This entire operation is often referred to as the max* function. Because of the computational complexity of the max* operation, a further simplification is often made by simply ignoring the second term of the max* function. This algorithm is typically referred to as the max-log-MAP algorithm. Although the max-log-MAP algorithm reduces the number of operations required, it also increases the bit error rate of the decoder because the computations are not as accurate. Indeed, it has been shown that coding gain of a log-MAP decoding is superior by 0.7 db as compared to the max-log-MAP algorithm.

Even in codecs that utilize the max* operation, different methods exist for implementing this function. For example, digital signal processors (DSPs) are often used to perform the various codec functions, including the max* operation. However, DSPs are typically general purpose processors that must be programmed appropriately to perform the desired functions. As such, DSP codecs are typically slower and more power hungry than custom hardware codecs.

In custom hardware codecs, the time required to perform a max* operation is linearly proportional to the clock speed of the codec, and the power consumption is proportional to the number of gates used in the circuitry to perform the max* operation. To date, improvements in speed have largely been accomplished through increases in clock speed and optimization of gate design, but these techniques produce only limited improvements. Accordingly, it would be advantageous to identify other techniques to increase speed and/or reduce power consumption.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, there is provided a turbo decoder having at least one lookup table adapted to process selected lower significant bits of a digital signal prior to a most significant bit of the digital signal becoming stable. As set forth by way of example below, by processing the selected lower significant bits in at least one lookup table prior to the most significant bit becoming stable, the turbo decoder can perform operations during time that would otherwise not be used for such operations, thus increasing the computational speed of the turbo decoder.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
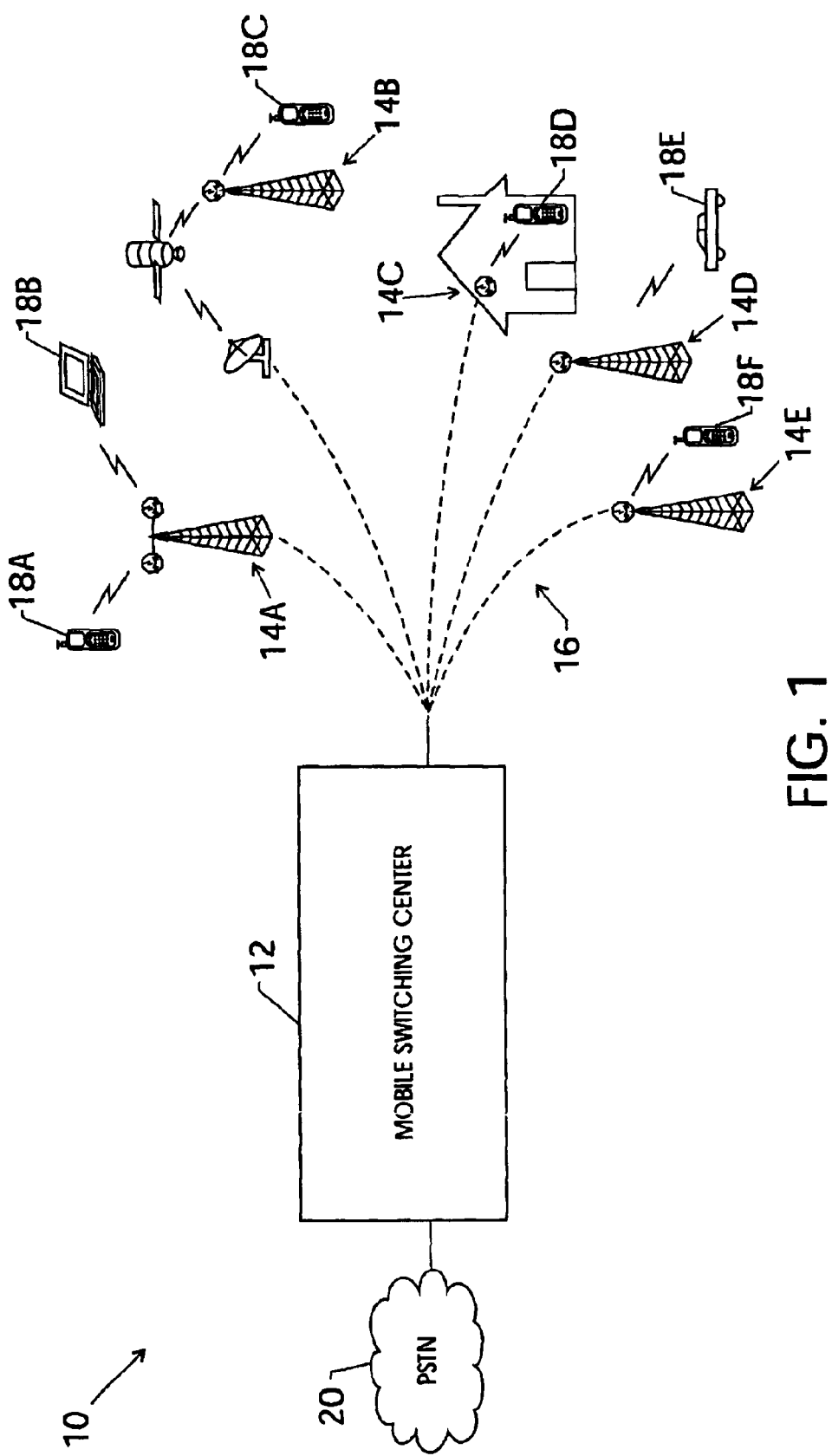
FIG. 1 illustrates an exemplary wireless communications network in accordance with the present invention.

Turning now to the drawings, and referring initially to FIG. 1, an exemplary wireless communication system is illustrated and designated by a reference numeral 10. In any given cellular market, such as a typical metropolitan area, a wireless communications system 10, or cellular network, may include at least one mobile switching center 12 that is coupled to multiple base transceiver stations 14A–E via a network 16. The mobile switching center 12 is the switch that serves the wireless system, and it performs the function of switching calls to the appropriate destination and maintaining the connection. Indeed, the primary purpose of the mobile switching center 12 is to provide a voice path connection between a mobile telephone another telephone, such as another mobile telephone or a land-line telephone. A typical mobile switching center includes a number of devices that control switching functions, call processing, channel assignments, data interfaces, tracking, paging, call handoff, billing, and user data bases.

The mobile switching center is typically coupled to the Public Switched Telephone Network (PTSN) 20, which is often referred to as a landline telephone network. A typical cellular network includes a connection to the PSTN because a majority of all cellular telephone calls pass through the PSTN.

The transceiver units 14A–E may take any suitable form. For example, the transceiver units may include antennas mounted on a tower, such as shown by the transceiver units 14A, 14B, 14D, and 14E, or the transceiver units may include an antenna mounted on a building, such as the transceiver unit 14C. Furthermore, the transceiver units 14A–E may communicate voice and/or data with any suitable communications device, such as portable cellular telephones 18A, 18C, 18D, and 18F, vehicles having mobile cellular telephones and/or navigation systems 18E, computer systems having wireless modems 18B, and/or satellite systems.

Figure 2:
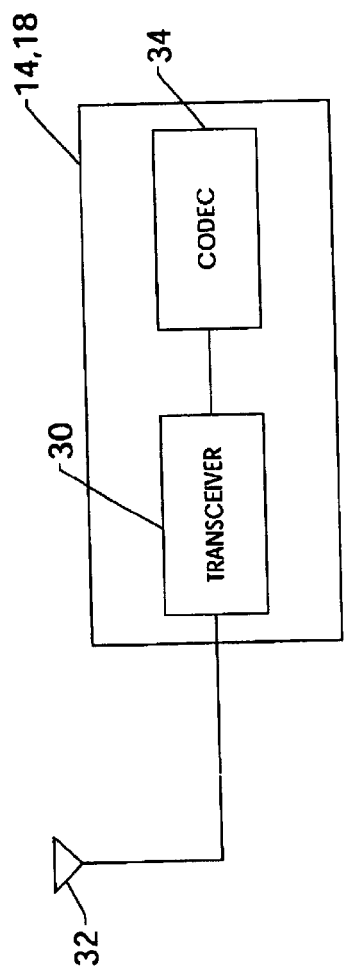
FIG. 2 illustrates a block diagram of a device, such as a base transceiver station or a portable communication device, including a codec in accordance with the present invention.

It should be understood that both the base transceiver stations 14 and the portable wireless devices 18 include, among many other things, a transceiver 30 that transmits and receives signals over the air interface via an antenna 32, as well as a coder/decoder (codec) 34 that codes the signals prior to transmission and decodes the signals after receipt, as illustrated in FIG. 2. As can be appreciated, the codec 34 may take many forms. Indeed, even if turbo codes are used, the codec 34 may include a DSP or custom hardware to perform its coding and/or decoding functions. However, for the purposes of discussion of the present exemplary techniques, it is useful to discuss examples in which the codec 34 performs turbo coding and decoding and in which at least the circuitry for performing the max* operation is provided using custom hardware.

Figure 3:
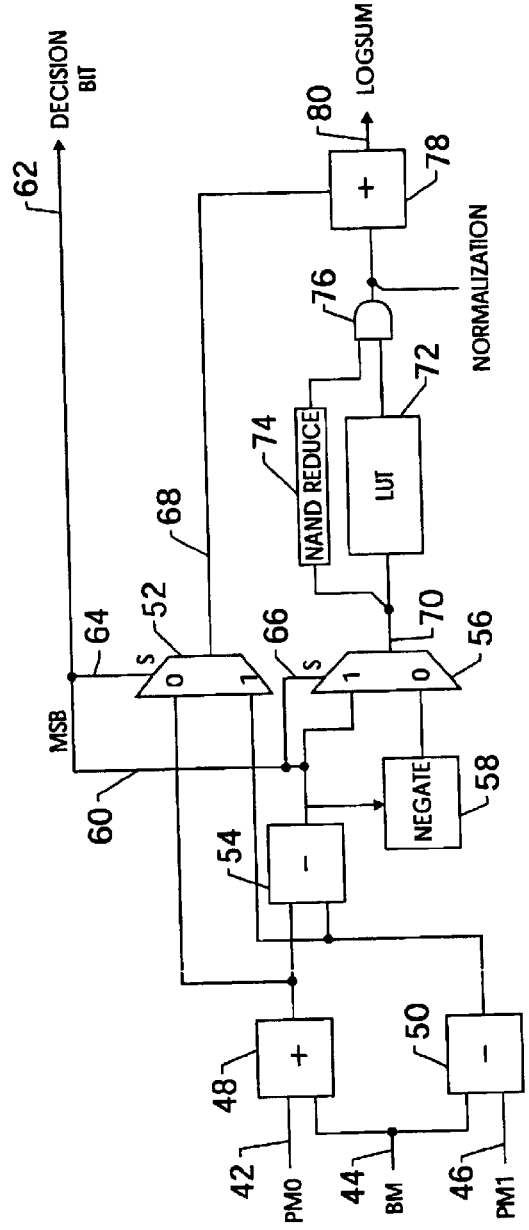
FIG. 3 illustrates a schematic diagram of a radix-2 max* circuit with a lookup table.
Figure 4:
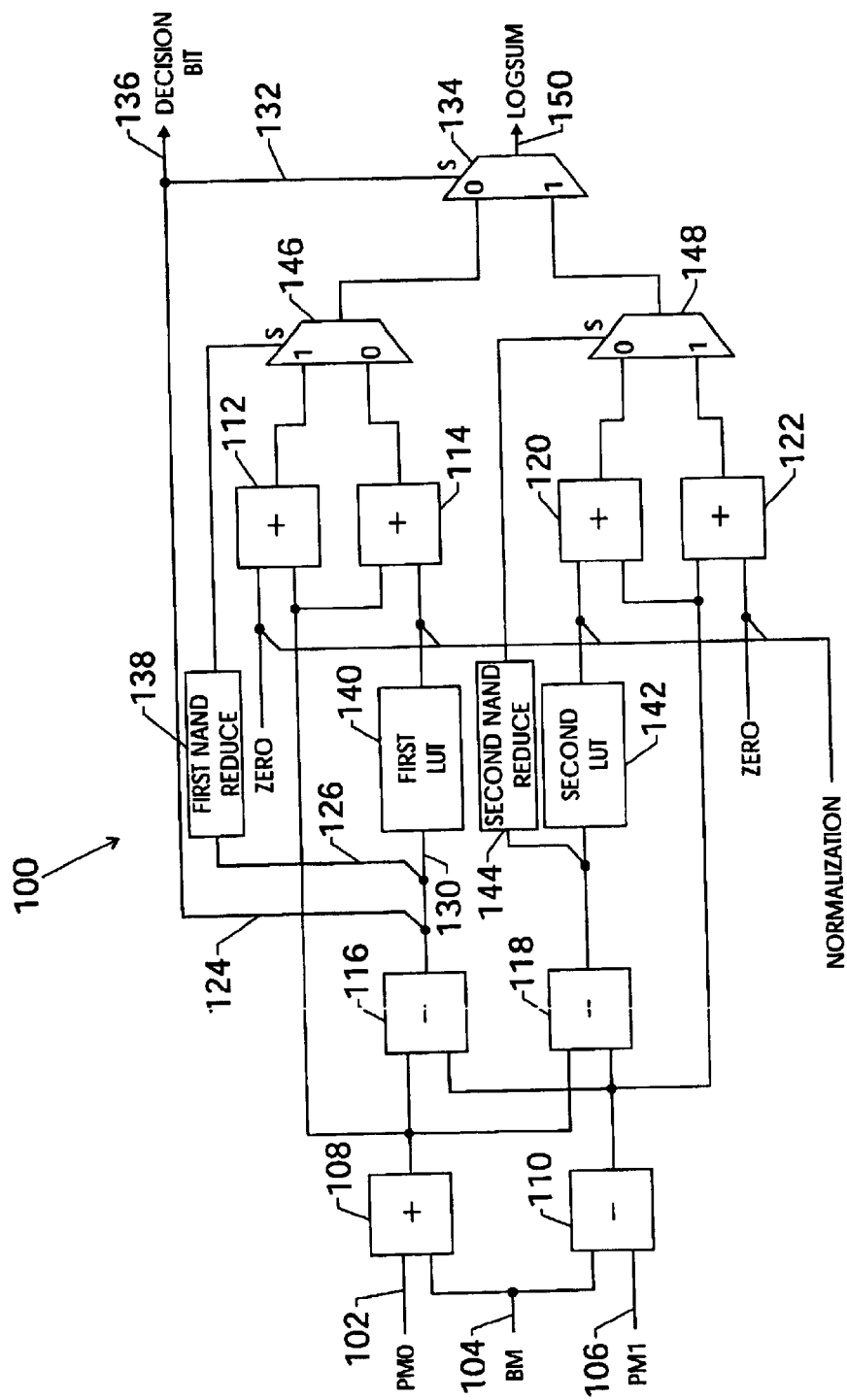
FIG. 4 illustrates a schematic diagram of an exemplary architecture in accordance with the present invention for performing a faster max* computation as compared with the circuit set forth in FIG. 3.

Prior to discussing the exemplary architecture for performing a faster max* computation set forth in FIG. 4, it is useful first to discuss the operation of another circuit for performing the max* operation, so that comparisons can be made between the two architectures. Hence, to form a baseline in this exemplary comparison, FIG. 3 illustrates a schematic diagram of a radix-2 max* circuit, which is generally designated by the reference numeral 40. The circuit 40 receives digital input signals PM0, BM, and PM1 on lines 42, 44, and 46, respectively. Each of these signals is typically a 10-bit signal. The PM0 and BM signals are delivered to an adder 48, and the PM1 and BM signals are delivered to a subtractor 50. The output of the adder 48 is delivered to the "0" input of a multiplexor 52 and to the input of a subtractor 54. Similarly, the output of the subtractor 50 is delivered to the "1" input of the multiplexor 52 and to the other input of the subtractor 54.

In 2's compliment arithmetic, it should be appreciated that when n-bit digital signals are added or subtracted, the result is an (n+1)-bit signal in which the most significant bit (MSB) indicates the sign, i.e., whether the number is positive or negative. In this example, the output from the subtractor 54 may be 12-bits, which are delivered to the negate circuit 58. Only the first 11 bits from the subtractor 54, i.e., bits 10:0, are delivered to the "1" input of the multiplexor 56. Meanwhile, the MSB, i.e., bit 11, is delivered on a line 60.

The MSB not only serves as a decision bit on an output line 62 of the circuit 40, it also serves as a select signal on lines 64 and 66 for the multiplexors 52 and 56, respectively. In other words, if the MSB is a logical 0, it will cause the multiplexor 52 to output onto the line 68 the 11-bit signal from the adder 48 delivered to the "0" input of the multiplexor 52, and it will also cause the multiplexor 56 to output onto the line 70 the 11-bit signal received on the "0" input of the multiplexor 56 from the negate circuit 58. Similarly, if the MSB is a logical 1, it will cause the multiplexor 52 to output onto the line 68 the 11-bit signal received on the "1" input of the multiplexor 52 from the subtractor 50, and it will also cause the multiplexor 56 to output onto the line 70 the 11-bit signal received on the "1" input of the mulitplexor 56 from the subtractor 54.

It should be appreciated that the output of the multiplexor 52 is the max function, while the output of the multiplexor 56 is used to perform the second function in the max* operation. It has been shown that the second function can be implemented with a lookup table (LUT) of only eight entries with minimal degradation in decoder performance. Because the second term is $\ln(1+e^{-|a-b|})$, the positive result, i.e., the absolute value of a−b, is selected by the MSB as the appropriate output on line 70 from the multiplexor 56. The first 4 bits, i.e., bits 3:0, are delivered to a lookup table 72, and the upper 6 bits, i.e., bits 9:4, are delivered to a "NAND reduce" circuit 74. Thus, while the lookup table 72 determines the appropriate result or value set by the first 4 bits (3:0), the NANI) reduce circuit 74 tests the upper 6 bits (9:4) to determine whether they are all logical 0s. If so, the NAND reduce circuit 74 delivers a logical 1 to an AND gate 76, which results in the output of the bokup table 72 being selected by the AND gate 76 and delivered to an adder 78. However, if any of the upper 6 bits (9:4) are a logical 1, the NAND reduce circuit 74 delivers a logical 0 to the AND gate 76 causing it to disregard the output of the lookup table 72. In either event, the adder 78 adds the result to the max operation and outputs the log sum on the line 80.

As can be seen from a study of the circuit 40, the most significant bit must be stable before the lookup table 72 can begin processing. This is true because the MSB is used to select the outputs of the multiplexors 52 and 56. However, bits which are being added or subtracted become stable from the least significant bit to the most significant bit. Therefore, even though bits 9:0 are available prior to the MSB becoming stable, the lookup table 72 and the NAND reduce circuit 74 cannot perform their operations until after the MSB becomes stable and selects the appropriate output from the multiplexor 56.

To address one or more of the concerns mentioned above, an architecture is proposed in which the multiplexors are moved to the opposite side of the lookup table and the final adder so that the lookup table and the final adder may perform their operations prior to the most significant bit becoming stable. It should be appreciated that this circuit may be used in a custom hardware codec or as a co-processor in a DSP. As discussed below, the look up table(s) may commence operation after the least significant bits become stable, but before the MSB becomes stable, thus enhancing the speed of the circuit. One example of such an architecture is illustrated in FIG. 4 by the circuit 100. In the circuit 100, the input signals PM0, BM, and PM1 are delivered on lines 102, 104, and 106, respectively. The PM0 and BM signals are delivered to an adder 108, while the BM and PM1 signals are delivered to a subtractor 110. The output of the adder 108 is delivered to the inputs of adders 112 and 114, as well as the inputs of subtractors 116 and 118. Similarly, the output of the subtractor 110 is delivered to the input of the adders 120 and 122, as well as the input of the subtractors 116 and 118.

The output of the subtractor 116 is separated such that the MSB, i.e., bit 11, is delivered on a line 124, the upper bits, i.e., 10:4, are delivered on the lines 126, and the lower bits, i.e., 3:0, are delivered on the lines 130. The MSB is delivered on the line 132 to a multiplexor 134 as a select bit, and the MSB is also delivered as an output of the circuit 100 on a line 136 to be used as a decision bit.

The upper bits (10:4) on the lines 126 are delivered to a first NAND reduce circuit 138, and the lower bits (3:0) are delivered to a first lookup table 140. Since the MSB is not stable at the time the bits 10:0 are delivered to the first NAND reduce circuit 138 and the first lookup table 140, it is not known whether the result output by the subtractor 116 is positive or negative. Accordingly, the output of the subtractor 118 delivers the lower bits, i.e., 3:0, to a second lookup table 142 and the upper bits, i.e., 10:4, to a second NAND reduce circuit 144. Therefore, the output of the first circuit 138, 140 or the second circuit 142, 144 may eventually be chosen once the sign is determined when the MSB becomes stable.

The output of the first NAND reduce circuit 138 is delivered to a multiplexor 146, and the output of the second NAND reduce circuit 144 is delivered to a multiplexor 148. The outputs of the first and second NAND reduce circuits 138 and 144 are determined in the same manner as the NAND reduce circuit 74 described previously. In other words, if all of the upper bits (9:4) are logical 0s, the NAND reduce circuits 138 and 144 output a logical 1, but if any of the upper bits (9:4) are a logical 1, the NAND reduce circuits 138 and 144 output a logical 0.

The output of the first lookup table 140 is delivered to the adder 114. The output of the adder 112 is delivered to the "1" input of the multiplexor 146, and the output of the adder 114 is delivered to the "0" input of the multiplexor 146. Therefore, because the output of the first NAND reduce circuit 138 is delivered to the select input of the multiplexor 146, the information based on the first lookup table 140 will be delivered by the multiplexor 146 if the output of the first NAND reduce circuit 138 is "1," while the output from the first lookup table 140 will be disregarded if the output of the first NAND reduce circuit 138 is 0. Similarly, the output of the second lookup table 142 is delivered to the adder 120. The output of the adder 120 is delivered to the "1" input of the multiplexor 148, while the output of the adder 122 is delivered to the "0" input of the multiplexor 148. Thus, if the output of the second NAND reduce circuit 144 is 1, the information based on the output of the second lookup table 142 will be delivered at the output of the multiplexor 148, while if the output of the second NAND reduce circuit 144 is 0, the information based on the output of the second lookup table 142 will be disregarded in favor of the output from the adder 122.

The outputs from the multiplexors 146 and 148 are delivered to the "0" and "1" inputs, respectively, of the multiplexor 134. Thus, when the MSB becomes stable, it is used to select the appropriate positive or negative result as the log sum to be output on the lines 150.

Because the multiplexors 146, 148, and 134 are placed on the downstream side of the lookup tables 140 and 142, the lookup tables 140 and 142 can start operating on the stable least significant bits long before the upper bits and the MSB become stable. Therefore, the time required for the lookup tables 140 and 142 to perform their operations is "hidden" as compared with the operations of the lookup table 72 in the circuit 40. As a result, the time it takes for the lookup tables 140 and 142 to perform their operations does not contribute to the longest signal path in the circuit 100, while the time for the lookup table 72 to perform its operation clearly contributes to the longest signal path in the circuit 40. As a result, the circuit 100 performs the max* operation faster than the circuit 40 given similar process technology and constraints.

A table illustrating a comparison of a radix-2 max-log-MAP algorithm, a radix-2 max* algorithm, and the architecture illustrated in FIG. 4 is set forth below.

TABLE 1

Comparison of new design with prior art

| Design | Size in .3 μm Technology | Speed |
| --- | --- | --- |
| Radix-2 max | 2110 gates | 2.22 ns |
| Radix-2 max* Circuit 40 | 4350 gates | 2.87 ns |
| Enhanced Radix-2 max* Circuit 100 | 4430 gates | 2.59 ns |

As can be seen from the above table, the circuit 100 performs each max* computation approximately 10% faster than the circuit 40, while using only approximately 2% more gates.

It should be understood that the circuit 100 is merely an example of a circuit that may be designed using the techniques described herein. Indeed, these techniques may be utilized in a circuit similar to the circuit 100, in which the multiplexors 146 and 148 may be located between the lookup tables 140 and 142 and the adders 112, 114, 120, and 122. Indeed, while the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A digital circuit for a turbo decoder comprising:
   at least one lookup table adapted to process selected lower significant bits of a digital signal prior to a most significant bit of the digital signal becoming stable.

2. The digital circuit, as set forth in claim 1, wherein the digital signal comprises an operand in a max* computation.

3. The digital circuit, as set forth in claim 1, wherein the at least one lookup table comprises a first lookup table and a second lookup table.

4. The digital circuit, as set forth in claim 3, wherein the first lookup table processes a positive version of the digital signal and wherein the second lookup table processes a negative version of the digital signal.

5. The digital circuit, as set forth in claim 4, wherein one of results from the first lookup table and results from the second lookup table is selected by the most significant bit of the digital signal after it becomes stable.

6. The digital circuit, as set forth in claim 1, wherein the digital circuit comprises a portion of a custom hardware turbo decoder.

7. The digital circuit, as set forth in claim 1, wherein the digital circuit comprises a co-processor of a DSP turbo decoder.

8. A turbo decoder comprising:
   a first lookup table adapted to process a first digital signal to perform a portion of a max* operation to obtain a first result;
   a second lookup adapted to process a second digital signal to perform a portion of a max* operation to obtain a second result; and
   a multiplexor adapted to receive a first signal correlative to the first result and a second signal correlative to the second result and to output one of the first signal and the second signal in response a selection by a most significant bit of the first digital signal.

9. The turbo decoder, as set forth in claim 8, wherein the first lookup table begins to process the first digital signal before the most significant bit of the first digital signal becomes stable, and wherein the second lookup table begins to process the second digital signal before the most significant bit of the first digital signal becomes stable.

10. A turbo decoder having a max* circuit capable of computing at least 10% faster than a traditional radix-2 max* circuit given identical constraints.

11. A wireless communications system comprising:
   at least one base transceiver unit having a turbo codec, the turbo codec having at least one lookup table adapted to begin processing lower significant bits of a digital signal related to a max* operation prior to a most significant bit of the digital signal becoming stable.

12. The system, as set forth in claim 11, wherein the at least one base transceiver unit comprises at least one antenna to facilitate communications over an air interface.

13. The system, as set forth in claim 12, wherein the at least one base transceiver unit comprises a structure on which the antenna resides.

14. The system, as set forth in claim 13, wherein the structure comprises a tower.

15. The system, as set forth in claim 13, wherein the structure comprises a building.

16. The system, as set forth in claim 11, comprising at least one portable communications device.

17. The system, as set forth in claim 16, wherein the at least one portable communications device comprises a cellular telephone.

18. The system, as set forth in claim 16, wherein the at least one portable communications device comprises a vehicle having at least one of a mobile telephone and a navigation system.

19. The system, as set forth in claim 16, wherein the at least one portable communications device comprises a computer having a wireless modem.

20. The system, as set forth in claim 11, comprising a mobile switching center communicatively coupled to the at least one base transceiver unit.

21. A method of turbo decoding, the method comprising the acts of:
   processing in a first lookup table a first digital signal to perform a portion of a max* operation to obtain a first result;

processing in a second lookup table a second digital signal to perform a portion of a max* operation to obtain a second result; and choosing between a first signal correlative to the first result and a second signal correlative to the second result in response a selection by a most significant bit of the first digital signal.

22. The method, as set forth in claim 21, wherein the act of processing in a first lookup table comprises the act of:

processing lower significant bits of the first digital signal prior to the most significant bit of the first digital signal becoming stable.

23. The method, as set forth in claim 21, wherein the act of processing in a second lookup table comprises the act of:

processing lower significant bits of the second digital signal prior to the most significant bit of the first digital signal becoming stable.

24. A method of turbo decoding, the method comprising the acts of:

processing in a first lookup table selected lower significant bits of a first digital signal prior to a most significant bit of the first digital signal becoming stable; and processing in a second lookup table selected lower significant bits of a second digital signal prior to the most significant bit of the first digital signal becoming stable.

* * * * *